United States Patent
Yeh et al.

(10) Patent No.: US 7,327,555 B2
(45) Date of Patent: Feb. 5, 2008

(54) CAPACITOR STRUCTURE

(75) Inventors: Ta-Hsun Yeh, Hsin-Chu (TW);
Yuh-Sheng Jean, Yun-Lin Hsien (TW)

(73) Assignee: Realtek Semiconductor Corp., HsinChu (TW)

( * ) Notice: Subject to any disclaimer, the term of this patent is extended or adjusted under 35 U.S.C. 154(b) by 84 days.

(21) Appl. No.: 11/277,046

(22) Filed: Mar. 21, 2006

(65) Prior Publication Data

US 2006/0221541 A1    Oct. 5, 2006

(30) Foreign Application Priority Data

Mar. 29, 2005    (TW)    ............... 94109778 A

(51) Int. Cl.
H01G 4/06    (2006.01)
(52) U.S. Cl. .............. 361/313; 361/302; 361/303; 361/311; 361/312; 361/306.1
(58) Field of Classification Search ............ 361/306.1, 361/306.3, 321.1, 321.2, 311–313, 302–305, 361/306.2
See application file for complete search history.

(56) References Cited

U.S. PATENT DOCUMENTS

| 5,220,483 | A | 6/1993 | Scott |
| 5,583,359 | A | 12/1996 | Ng et al. |
| 6,072,689 | A * | 6/2000 | Kirlin ..................... 361/311 |
| 6,098,282 | A * | 8/2000 | Frankeny et al. ............ 29/852 |
| 6,407,929 | B1 * | 6/2002 | Hale et al. .................. 361/763 |
| 6,690,570 | B2 * | 2/2004 | Hajimiri et al. ......... 361/306.1 |
| 6,743,671 | B2 * | 6/2004 | Hu et al. .................... 438/253 |
| 6,784,050 | B1 | 8/2004 | Aram et al. |
| 6,822,312 | B2 * | 11/2004 | Sowlati et al. ............. 257/532 |
| 6,917,509 | B1 * | 7/2005 | Devoe et al. ............... 361/309 |
| 7,136,272 | B2 * | 11/2006 | Li et al. .................. 361/306.1 |

\* cited by examiner

Primary Examiner—Nguyen T. Ha
(74) Attorney, Agent, or Firm—Winston Hsu

(57) ABSTRACT

A capacitor structure includes a first electrode structure, a second electrode structure, and a capacitor dielectric. The first electrode structure includes a plurality of first conductive plates vertically disposed and parallel to one another. The second electrode structure includes a plurality of second conductive plates disposed alternately with the first conductive plates. Each first conductive plate includes a plurality of first conductive bars electrically coupled to the first conductive bar stacked thereon with at least a first conductive via. Each second conductive plate includes a plurality of second conductive bars electrically coupled to the second conductive bar stacked thereon with at least a second conductive via.

10 Claims, 4 Drawing Sheets

US 7,327,555 B2

CAPACITOR STRUCTURE

BACKGROUND OF THE INVENTION

1. Field of the Invention

The present invention relates to a capacitor structure, and more particularly, to a longitudinal plate capacitor structure that utilizes conductive vias to improve capacitance.

2. Description of the Prior Art

Capacitors, devices for storing electric charge, are frequently adopted in various integrated circuits. Basically, there are various kinds of capacitor structures, such as disclosed in U.S. Pat. Nos. 5,220,483, 5,583,359, 6,743,671 and 6,784,050. Normally, the capacitance of the capacitor structure is designed to be as large as possible so as to reduce related manufacture costs.

SUMMARY OF THE INVENTION

It is one of the objects of the present invention to provide a capacitor structure with a high capacitance.

It is one of the objects of the present invention to reduce the manufacture cost.

According to the claimed invention, a capacitor structure is disclosed. The capacitor structure includes a first electrode structure, a second electrode structure, and a dielectric layer. The first electrode structure includes a plurality of first conductive plates in parallel with one another. Each first conductive plate includes a plurality of first conductive bars, and each two adjacent first conductive bars are electrically coupled to each other by at least a first conductive via. The second electrode structure includes a plurality of second conductive plates in parallel with one another. The second conductive plates are disposed in alternation with the first conductive plates. Each second conductive plate includes a plurality of second conductive bars. Each two adjacent second conductive bars are electrically coupled to each other by at least a second conductive via. The dielectric layer is disposed between the first conductive plates and the second conductive plates. In addition, the capacitance of the capacitor structure is determined by the parallel section between the first conductive bars and the second conductive bars, and between the first conductive via and the second conductive via.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
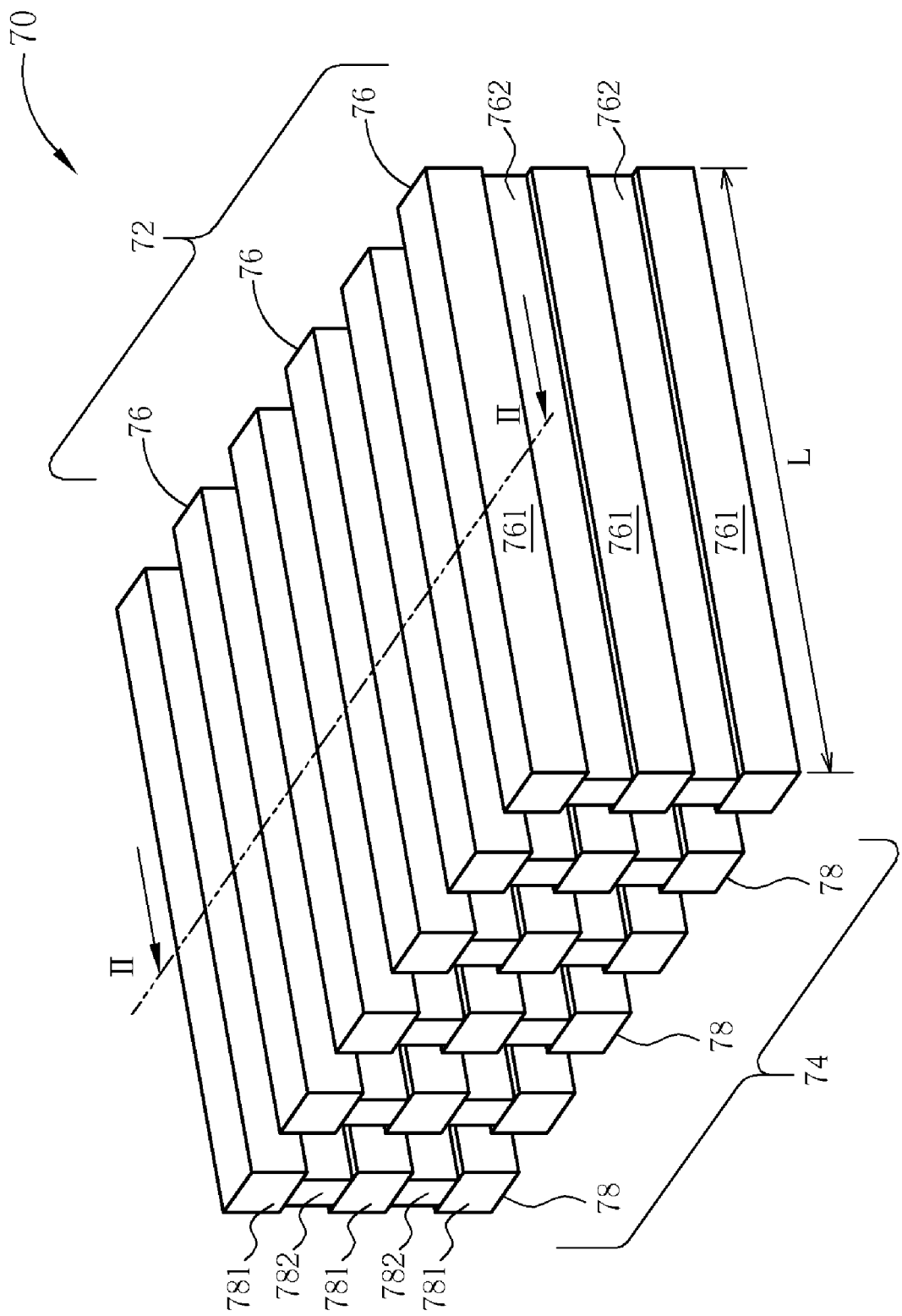
FIG. 1 shows a schematic oblique view of a capacitor structure according to a preferred embodiment of the present invention.
Figure 2:
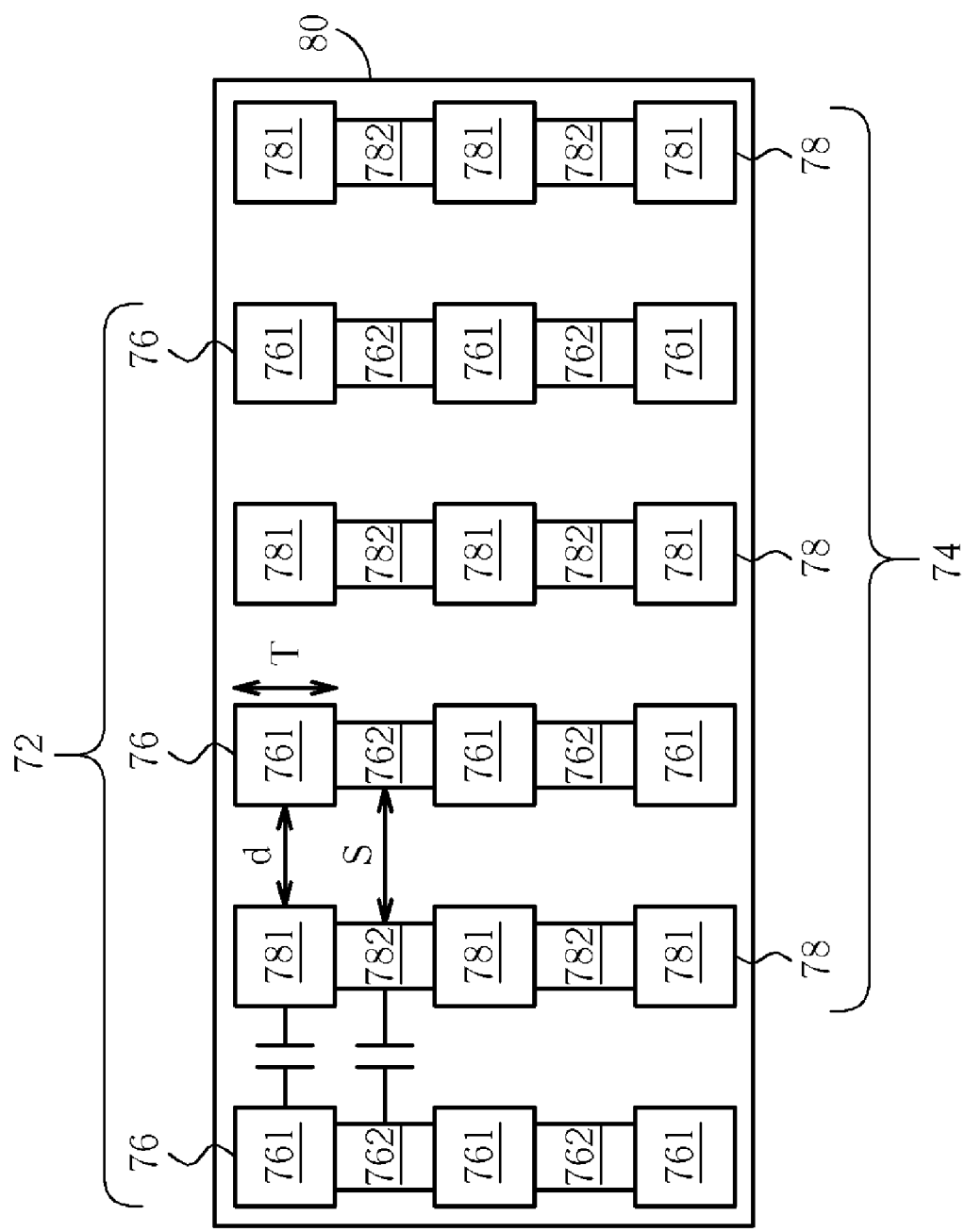
FIG. 2 shows a schematic cross-sectional view of the capacitor structure shown in FIG. 1 along the line II-II.

Please refer to FIG. 1 and FIG. 2. FIG. 1 shows a schematic oblique view of a capacitor structure 70 according to a preferred embodiment of the present invention, and FIG. 2 shows a schematic cross-sectional view of the capacitor structure 70 shown in FIG. 1 along the line II-II. As shown in FIG. 1 and FIG. 2, the capacitor structure 70 includes a first electrode structure 72 and a second electrode structure 74. The voltages applied to the first electrode structure 72 and the second electrode structure 74 are not equal. The first electrode structure 72 includes a plurality of first conductive plates 76 disposed vertically and in parallel with one another. The second electrode structure 74 includes a plurality of second conductive plates 78 disposed vertically and in parallel with one another. Each first conductive plate 76 and each second conductive plate 78 are arranged in alternation with one another. In addition, each first conductive plate 76 includes a plurality of first conductive bars 761, and each first conductive bar 761 is electrically coupled to the first conductive bar 761 stacked thereon with a first conductive via 762. Each second conductive plate 78 includes a plurality of second conductive bars 781, and each second conductive bar 781 is electrically coupled to the second conductive bar 781 stacked thereon with a second conductive via 782. Furthermore, a capacitor dielectric layer 80 (not shown in FIG. 1) is disposed between the first conductive plates 76 and the second conductive plates 78.

In this embodiment as shown in FIG. 2, each two adjacent first conductive bars 761 of the first conductive plates 76 are coupled together with a first conductive via 762, and the horizontal cross-sectional area of the first conductive via 762 is substantially equal to the horizontal cross-sectional area of the first conductive bar 761 adjacent to the first conductive via 762. Similarly, each two adjacent second conductive bars 781 of the second conductive plates 78 are coupled together with a second conductive via 782, and the horizontal cross-sectional area of the second conductive via 782 is substantially equal to the horizontal cross-sectional area of the second conductive bar 781 adjacent to the second conductive via 782. It should be noted that the horizontal cross-sectional area of the conductive via is substantially equal to the horizontal cross-sectional area of the conductive bar. However, the present invention is not limited by the above embodiment. In practice, the relation between the horizontal cross-sectional area of the conductive via and the conductive bar can be modified where necessary.

It can be seen that the lateral area of the first conductive plates 76 is substantially equal to the lateral area sum of the first conductive bars 761 and the first conductive vias 762. Similarly, the lateral area of the second conductive plates 78 is substantially equal to the lateral area sum of the second conductive bars 781 and the second conductive vias 782. In that case, the overlapping area between the first electrode structure 72 and the second electrode structure 74 increases as the lateral area of the first conductive vias 762 and the second conductive vias 782 increases. In other words, the capacitance of the capacitor structure 70 increases as the lateral area of the first conductive vias 762 and the second conductive vias 782 increases. In this embodiment, the first conductive vias 762 and the second conductive vias 782 contribute more than 5% (practically more than 10%) of the overall capacitance of the capacitor structure 70.

Figure 3:
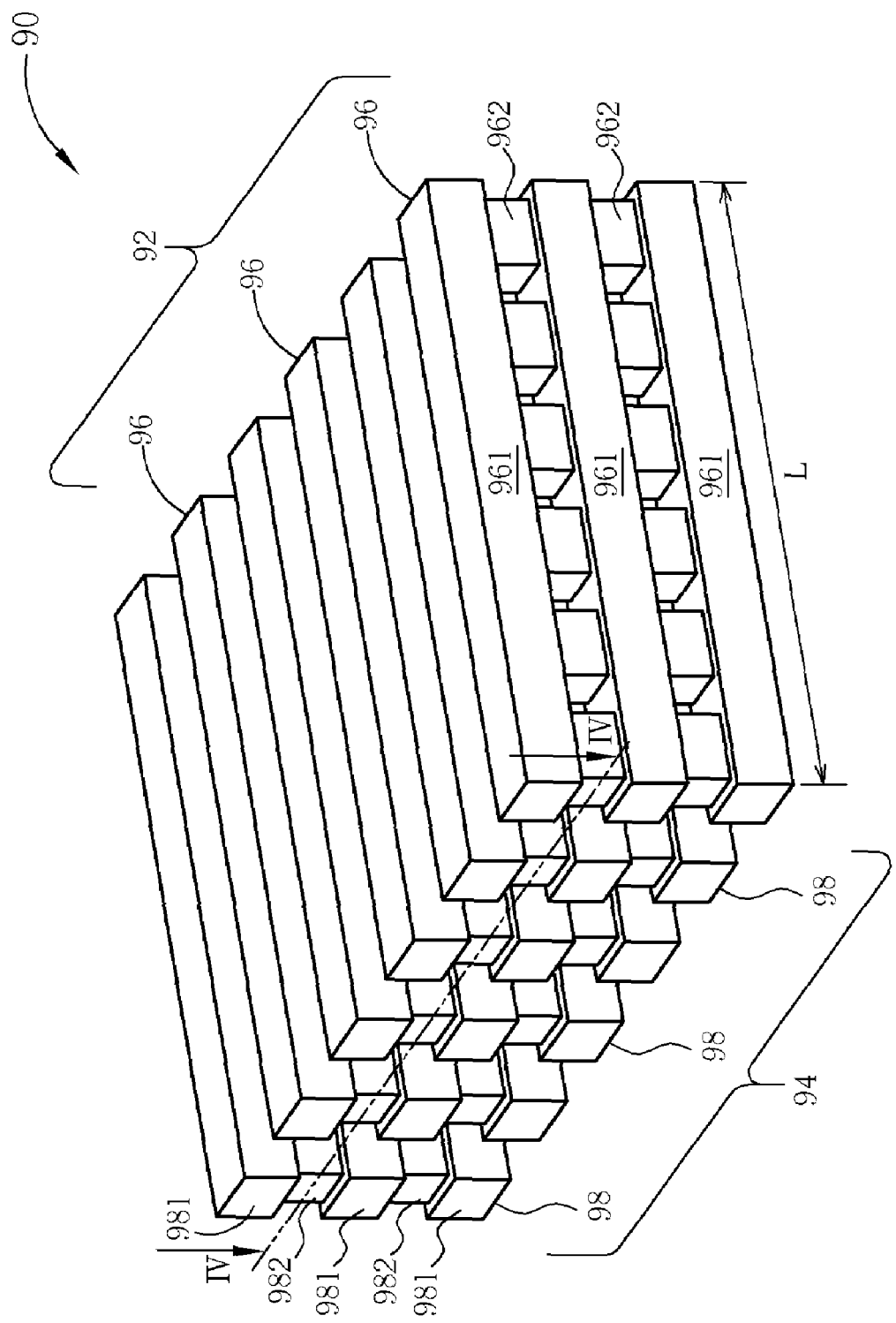
FIG. 3 shows a schematic oblique view of a capacitor structure according to another preferred embodiment of the present invention.
Figure 4:
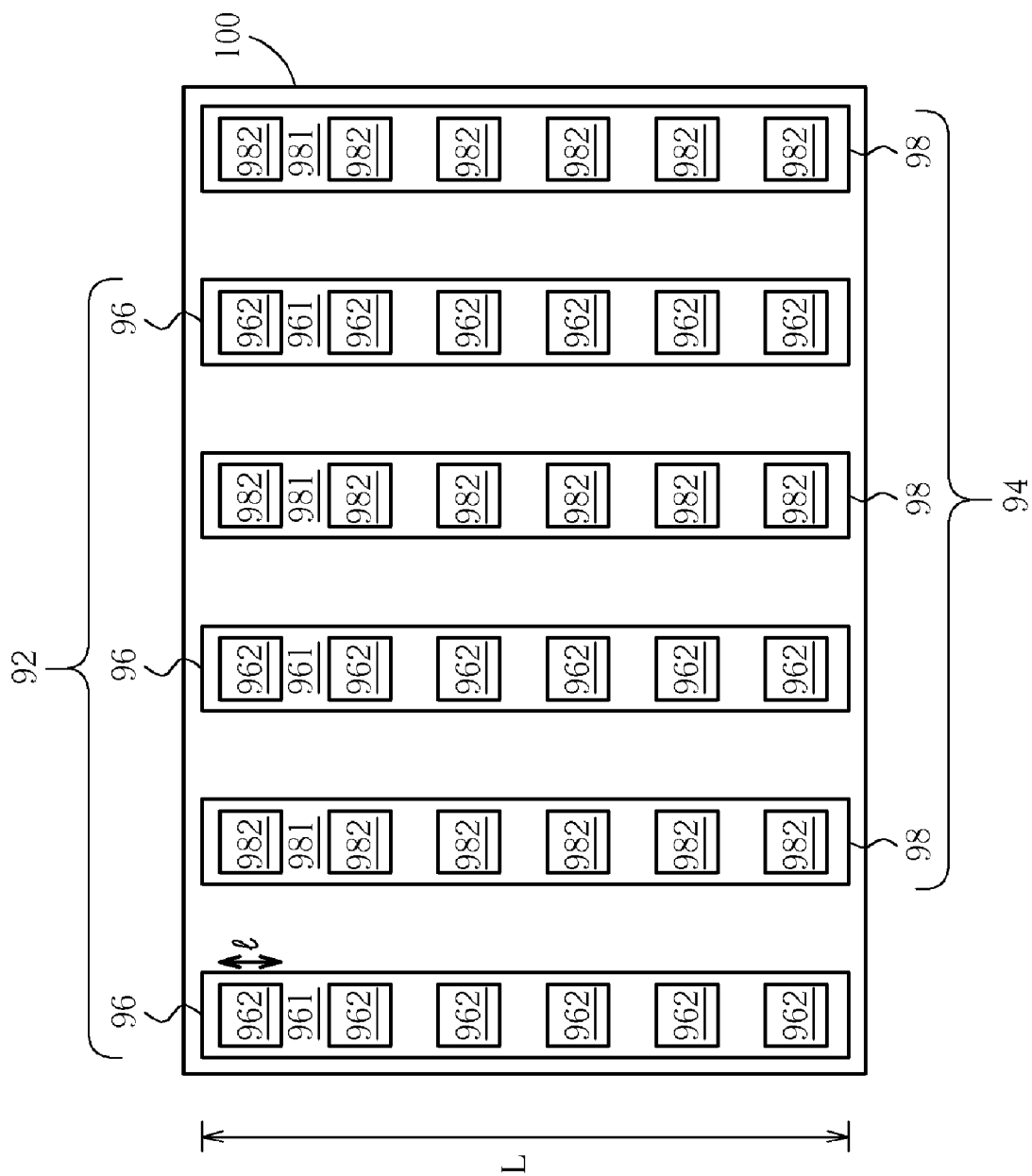
FIG. 4 shows a schematic cross-sectional view of the capacitor structure shown in FIG. 3 along the line IV-IV.

Please refer to FIG. 3 and FIG. 4. FIG. 3 shows a schematic oblique view of a capacitor structure 90 according to another preferred embodiment of the present invention, and FIG. 4 shows a schematic cross-sectional view of the capacitor structure 90 shown in FIG. 3 along the line IV-IV. As shown in FIG. 3 and FIG. 4, the capacitor structure 90 includes a first electrode structure 92 and a second electrode structure 94. The voltages applied to the first electrode structure 92 and the second electrode structure 94 are not equal. The first electrode structure 92 includes a plurality of first conductive plates 96 disposed vertically and in parallel with one another. The second electrode structure 94 includes a plurality of second conductive plates 98 disposed vertically and in parallel with one another. Each first conductive plate 96 and each second conductive plate 98 are arranged in alternation with one another. In addition, each first conductive plate 96 includes a plurality of first conductive bars 961, and each first conductive bar 961 is electrically coupled to the first conductive bar 961 stacked thereon with a plurality of first conductive vias 962. Each second conductive plate 98 includes a plurality of second conductive bars 981, and each second conductive bar 981 is electrically coupled to the second conductive bar 981 stacked thereon with a plurality of second conductive vias 982. Furthermore, a capacitor dielectric layer 100 (not shown in FIG. 3) is disposed between the first conductive plates 96 and the second conductive plates 98.

Different from the above embodiment, the first conductive bars 961 of the first conductive plates 96 are electrically coupled to one another with a plurality of first conductive vias 962 in the present embodiment as shown in FIG. 3 and FIG. 4. Similarly, the second conductive bars 981 of the second conductive plates 98 are electrically coupled to one another with a plurality of second conductive vias 982. Consequently, the lateral area of the first conductive plates 96 is substantially equal to the lateral area sum of the first conductive bars 961 and the first conductive vias 962. Likewise, the lateral area of the second conductive plates 98 is substantially equal to the lateral area sum of the second conductive bars 981 and the second conductive vias 982. Accordingly, the overlapping area between the first electrode structure 92 and the second electrode structure 94 increases as the lateral area of the first conductive vias 962 and the second conductive vias 982 increases. In other words, the capacitance of the capacitor structure 90 increases as the lateral area of the first conductive vias 962 and the second conductive vias 982 increases. In this embodiment, the first conductive vias 962 and the second conductive vias 982 contribute more than 5% (practically more than 10%) of the overall capacitance of the capacitor structure 70.

The present invention is not limited by the above embodiments. For instance, the horizontal cross-sectional plane of the conductive via in the second embodiment is a square, but it can also be other forms, such as a circular form or a rectangular from. In addition, the material of the first electrode structure and the second electrode structure can be metal, polysilicon, and other conductive materials. The capacitor dielectric layer can also be any suitable material in accordance with a desired capacitance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A capacitor structure comprising:
   a first electrode structure comprising a plurality of first conductive plates in parallel with one another, each first conductive plate comprising a plurality of first conductive bars, and each two adjacent first conductive bars being electrically coupled to each other by at least a first conductive via;
   a second electrode structure comprising a plurality of second conductive plates in parallel with one another, the second conductive plates being disposed in alternation with the first conductive plates, each second conductive plate comprising a plurality of second conductive bars, and each two adjacent second conductive bars being electrically coupled to each other by at least a second conductive via; and
   a dielectric layer disposed between the first conductive plates and the second conductive plates;
   wherein the horizontal cross-sectional area of the first conductive via is substantially equal to the horizontal cross-sectional area of each first conductive bar adjacent to the first conductive via, and voltages applied to the first electrode structure and the second electrode structure are not equal.

2. The capacitor structure of claim 1, wherein the horizontal cross-sectional area of the second conductive via is substantially equal to the horizontal cross-sectional area of each second conductive bar adjacent to the second conductive via.

3. The capacitor structure of claim 1, wherein the first conductive via and the second conductive via account for more than 5% of the capacitance of the capacitor structure.

4. A capacitor structure comprising:
   a first conductive plate comprising a plurality of first conductive bars, each two adjacent first conductive bars being electrically coupled to each other by at least a first conductive via, wherein the horizontal cross-sectional area of the first conductive via is substantially equal to the horizontal cross-sectional area of each first conductive bar adjacent to the first conductive via;
   a second conductive plate disposed in parallel with the first conductive plate, the second conductive plate comprising a plurality of second conductive bars, and each two adjacent second conductive bars being electrically coupled to each other by at least a second conductive via; and
   a dielectric layer disposed between the first conductive plate and the second conductive plate;
   wherein the capacitance of the capacitor structure is determined by the parallel section between the first conductive bars and the second conductive bars, and between the first conductive via and the second conductive via.

5. The capacitor structure of claim 4, wherein the horizontal cross-sectional area of the second conductive via is substantially equal to the horizontal cross-sectional area of each second conductive bar adjacent to the second conductive via.

6. The capacitor structure of claim 4, wherein voltages applied to the first conductive plate and the second conductive plate are not equal.

7. The capacitor structure of claim 4, wherein the first conductive via and the second conductive via account for more than 5% of the capacitance of the capacitor structure.

8. A capacitor structure comprising:
   a plurality of first conductive bars in parallel with each other, each two adjacent first conductive bars being electrically coupled to each other by at least a first conductive via, wherein the horizontal cross-sectional area of the first conductive via is substantially equal to the horizontal cross-sectional area of each first conductive bar adjacent to the first conductive via;
   a plurality of second conductive bars, each two adjacent second conductive bars being electrically coupled to each other by at least a second conductive via, the second conductive bars being parallel with the first conductive bars, and the first conductive via being parallel with the second conductive via; and a dielectric layer disposed between the first conductive bar and the second conductive bar, and between the first conductive via and the second conductive via;

wherein the first conductive via and the second conductive via account for more than 5% of the capacitance of the capacitor structure.

9. The capacitor structure of claim 8, wherein the horizontal cross-sectional area of the second conductive via is substantially equal to the horizontal cross-sectional area of each second conductive bar adjacent to the second conductive via.

10. The capacitor structure of claim 8, wherein voltages applied to the first conductive bars and the second conductive bars are not equal.

* * * * *